(12) United States Patent
Ning

(10) Patent No.: US 11,735,233 B2
(45) Date of Patent: Aug. 22, 2023

(54) METHOD AND SYSTEM FOR REGULATING MEMORY, AND SEMICONDUCTOR DEVICE

(71) Applicant: CHANGXIN MEMORY TECHNOLOGIES, INC., Hefei (CN)

(72) Inventor: Shu-Liang Ning, Hefei (CN)

(73) Assignee: CHANGXIN MEMORY TECHNOLOGIES, INC., Hefei (CN)

(*) Notice: Subject to any disclaimer, the term of this patent is extended or adjusted under 35 U.S.C. 154(b) by 29 days.

(21) Appl. No.: 17/449,573

(22) Filed: Sep. 30, 2021

(65) Prior Publication Data

US 2022/0068320 A1    Mar. 3, 2022

Related U.S. Application Data

(63) Continuation of application No. PCT/CN2021/100697, filed on Jun. 17, 2021.

(30) Foreign Application Priority Data

Aug. 27, 2020 (CN) .......................... 202010880909.6

(51) Int. Cl.
*G11C 7/00* (2006.01)
*G11C 7/04* (2006.01)
(Continued)

(52) U.S. Cl.
CPC ................ *G11C 7/04* (2013.01); *G11C 5/146* (2013.01); *G11C 7/109* (2013.01); *G11C 7/1063* (2013.01); *G11C 7/222* (2013.01)

(58) Field of Classification Search
CPC . G11C 7/04; G11C 7/1063; G11C 2207/2254; G11C 7/222; G11C 11/4074; G11C 5/146; G11C 11/4091; G11C 7/109; G11C 29/028; G11C 7/06; G11C 11/4076; G11C 7/1045; G11C 7/22; G11C 7/1093;
(Continued)

(56) References Cited

U.S. PATENT DOCUMENTS 4,806,801 A    2/1989 Argade
5,768,189 A    6/1998 Takahashi
(Continued)

FOREIGN PATENT DOCUMENTS

CN    1409288 A    4/2003
CN    101004945 A    7/2007
(Continued)

OTHER PUBLICATIONS

International Search Report in the international application No. PCT/CN2021/106060, dated Oct. 20, 2021.
(Continued)

*Primary Examiner* — Thong Q Le
(74) *Attorney, Agent, or Firm* — Syncoda LLC; Feng Ma

(57) ABSTRACT

A method for regulating the memory includes operations as follows. A mapping relationship among temperatures of a transistor, body bias voltages of the transistor, and data writing time of the memory is acquired, a current temperature of the transistor is acquired, the body bias voltage is regulated based on the current temperature and the mapping relationship, to enable the data writing time corresponding to the regulated body bias voltage to be within a preset writing time.

18 Claims, 5 Drawing Sheets

(51) Int. Cl.
  *G11C 7/22* (2006.01)
  *G11C 5/14* (2006.01)
  *G11C 7/10* (2006.01)

(58) Field of Classification Search
  CPC ... G11C 11/40; G11C 11/4063; G11C 29/021;
       G11C 7/24; G11C 2207/065; G11C
       7/062; G11C 7/065; G11C 7/1096; G11C
       7/16; G11C 11/4078; G11C 2207/2272;
       G11C 5/147; G11C 7/1066; G11C 7/12;
       G11C 8/08; G11C 29/023; G11C
       29/50012; G11C 11/407; G11C 11/409;
       G11C 16/0433; G11C 16/12; G11C 5/04;
       G11C 7/1084; G11C 11/4085; G11C
       11/4094; G11C 11/5621; G11C 16/20;
       G11C 16/3418; G11C 5/143; G11C
       7/1006; G11C 7/1051; G11C 11/40626;
       G11C 16/26; G11C 16/3404; G11C
       2029/5002; G11C 29/42; G11C 29/52;
       G11C 7/10; G11C 7/1048; G11C 7/1069;
       G11C 7/1072; G11C 7/20; G11C 11/406;
       G11C 29/44; G11C 29/46; G11C 7/00
  USPC ... 365/211, 189.02, 189.07, 225.7, 226, 227,
       365/228, 51, 63, 189.09, 212, 72
  See application file for complete search history.

(56) References Cited

U.S. PATENT DOCUMENTS

| | | | |
|---|---|---|---|
| 5,978,941 | A | 11/1999 | Katayama |
| 6,223,311 | B1 | 4/2001 | Katayama |
| 6,694,460 | B2 | 2/2004 | Katayama |
| 6,754,120 | B1 | 6/2004 | Bellows |
| 6,944,057 | B1 | 9/2005 | Runnion |
| 7,196,926 | B1 * | 3/2007 | Kim ............... H01L 27/0688 365/175 |
| 7,313,044 | B2 | 12/2007 | Fuhrmann |
| 7,379,355 | B2 | 5/2008 | Kim |
| 7,529,145 | B2 | 5/2009 | La Rosa |
| 7,577,014 | B2 | 8/2009 | Yamagami |
| 7,817,460 | B2 | 10/2010 | Yamagami |
| 7,995,414 | B2 | 8/2011 | Ito |
| 9,484,083 | B2 | 11/2016 | Moriwaki |
| 10,957,365 | B2 | 3/2021 | Lovett |
| 2001/0010086 | A1 | 7/2001 | Katayama |
| 2002/0024378 | A1 | 2/2002 | Forbes |
| 2002/0154545 | A1 | 10/2002 | Tanaka |
| 2005/0036362 | A1 | 2/2005 | Iwata |
| 2005/0174164 | A1 | 8/2005 | Fuhrmann |
| 2006/0133172 | A1 | 6/2006 | Schnabel |
| 2006/0220689 | A1 | 10/2006 | Kang |
| 2006/0274590 | A1 | 12/2006 | Fujita |
| 2007/0165474 | A1 | 7/2007 | Kim |
| 2007/0194381 | A1 | 8/2007 | Chun |
| 2007/0206404 | A1 | 9/2007 | Yamagami |
| 2008/0238530 | A1 | 10/2008 | Ito |
| 2009/0245003 | A1 | 10/2009 | Ito |
| 2009/0279347 | A1 | 11/2009 | Yamagami |
| 2010/0329026 | A1 | 12/2010 | Nakamura |
| 2012/0020169 | A1 | 1/2012 | Wang |
| 2012/0033487 | A1 | 2/2012 | Inoue |
| 2012/0275235 | A1 | 11/2012 | Parker |
| 2014/0092675 | A1 | 4/2014 | Wang et al. |
| 2015/0279449 | A1 | 10/2015 | Moriwaki |
| 2015/0310938 | A1 | 10/2015 | Kim et al. |
| 2016/0118106 | A1 | 4/2016 | Yoshimura et al. |
| 2017/0005641 | A1 | 1/2017 | Chhabra |
| 2017/0278578 | A1 | 9/2017 | Nagai et al. |
| 2018/0114550 | A1 | 4/2018 | Cho |
| 2020/0075063 | A1 | 3/2020 | Lovett |
| 2020/0082894 | A1 | 3/2020 | Singh et al. |
| 2020/0343245 | A1 | 10/2020 | Yamazaki et al. |
| 2020/0402577 | A1 | 12/2020 | Onuki et al. |
| 2022/0148660 | A1 | 5/2022 | Hioka |

FOREIGN PATENT DOCUMENTS

| | | |
|---|---|---|
| CN | 101030447 A | 9/2007 |
| CN | 101593552 A | 12/2009 |
| CN | 103474093 A | 12/2013 |
| CN | 103677966 A | 3/2014 |
| CN | 104952481 A | 9/2015 |
| CN | 105023609 A | 11/2015 |
| CN | 105677593 A | 6/2016 |
| CN | 205845518 U | 12/2016 |
| CN | 107358976 A | 11/2017 |
| CN | 107978329 A | 5/2018 |
| CN | 108109646 A | 6/2018 |
| CN | 108447511 A | 8/2018 |
| CN | 110875070 A | 3/2020 |
| CN | 110910925 A | 3/2020 |
| CN | 111009276 A | 4/2020 |
| CN | 111292776 A | 6/2020 |
| CN | 111316423 A | 6/2020 |
| CN | 111373476 A | 7/2020 |
| EP | 2444406 A1 | 4/2012 |
| EP | 3944248 A1 | 1/2022 |
| JP | H05266658 A | 10/1993 |
| JP | H0950325 A | 2/1997 |
| JP | H09265787 A | 10/1997 |
| JP | H10105533 A | 4/1998 |
| JP | 2003196991 A | 7/2003 |
| JP | 3942425 B2 | 7/2007 |
| JP | 2008004153 A | 1/2008 |
| JP | 2008270732 A | 11/2008 |
| JP | 2009295246 A | 12/2009 |
| JP | 2012161090 A | 8/2012 |
| WO | 9720625 A1 | 6/1997 |
| WO | 2019130144 A1 | 7/2019 |

OTHER PUBLICATIONS

International Search Report in the international application No. PCT/CN2021/103838, dated Sep. 28, 2021.
International Search Report in the international application No. PCT/CN2021/106093, dated Oct. 11, 2021.
International Search Report in the international application No. PCT/CN2021/100697, dated Aug. 27, 2021.
First Office Action of the U.S. Appl. No. 17/452,339, dated Apr. 27, 2023.
Notice of Allowance of the U.S. Appl. No. 17/510,453, dated Apr. 18, 2023.
First Office Action of the Chinese application No. 202010879440.4, dated May 27, 2023.
First Office Action of the Chinese application No. 202010879444.2, dated May 30, 2023.
Notice of Allowance of the Chinese application No. 202010880909.6, dated Jun. 1, 2023.
Supplementary European Search Report in the European application No. 21859939.7, dated Jul. 3, 2023. 9 pages.
Notice of Allowance of the Chinese application No. 202010880935.9, dated Jun. 14, 2023. 5 pages with English translation.

* cited by examiner

METHOD AND SYSTEM FOR REGULATING MEMORY, AND SEMICONDUCTOR DEVICE

CROSS-REFERENCE TO RELATED APPLICATIONS

This is a continuation of International Patent Application No. PCT/CN2021/100697 filed on Jun. 17, 2021, which claims priority to Chinese Patent Application No. 202010880909.6 filed on Aug. 27, 2020. The disclosures of these applications are hereby incorporated by reference in their entirety.

BACKGROUND

A memory device, as one of three indispensable parts of a computer, is one of key devices that determine the performance of a system. The memory, like a temporary warehouse, is responsible for data transfer and temporary storage.

SUMMARY

The present disclosure relates to the field of semiconductors, and in particular, to a method and system for regulating a method and a semiconductor device. Data writing time of the memory is regulated to ensure that the data writing time is within a preset time, thereby ensuring that data is completely written into a storage capacitor.

Various embodiments of the present disclosure provide a method for regulating a memory. The memory includes a transistor. A gate of the transistor is electrically connected with a word line of the memory, one of a source/drain of the transistor is connected with a bit line of the memory, and the other is electrically connected with a storage capacitor of the memory. The method includes operations as follows. A mapping relationship among temperatures of the transistor, body bias voltages of the transistor, and data writing time of the memory is acquired. A current temperature of the transistor is acquired. The body bias voltage is regulated based on the current temperature and the mapping relationship, to enable the data writing time corresponding to the regulated body bias voltage to be within the preset writing time.

The embodiment of the present disclosure further provides a system for regulating a memory, which includes a first acquiring module, a second acquiring module, a processing module, and a regulating module. The first acquiring module is configured to acquire a mapping relationship among temperatures of a transistor, body bias voltages of the transistor, and data writing time of the memory. The second acquiring module is configured to acquire a current temperature of the transistor. The processing module is configured to acquire a regulating manner of the body bias voltage based on the current temperature and the mapping relationship. The regulating module is configured to regulate the body bias voltage based on the regulating manner, to enable the data writing time of the memory corresponding to the regulated body bias voltage to be within a preset writing time.

The embodiment of the present disclosure further provides a semiconductor device, which includes a memory and a system for regulating the memory. The memory includes a transistor, and the system for regulating the memory includes a processor. The processor is configured to acquire a mapping relationship among temperatures of the transistor, body bias voltages of the transistor and data writing time of the memory; acquire a current temperature of the transistor; acquire a regulating manner of the body bias voltage based on the current temperature and the mapping relationship; and regulate the body bias voltage based on the regulating manner, to enable the data writing time of the memory corresponding to the regulated body bias voltage to be within a preset writing time.

BRIEF DESCRIPTION OF THE DRAWINGS

One or more embodiments are exemplarily described by corresponding drawings, and unless otherwise stated, diagrams in the drawings do not constitute scale limitation.

DETAILED DESCRIPTION

A key performance index of the memory is time of the memory for reading/writing data. The data is not written into a storage capacitor immediately in the memory, because charging for a strobe triode and the capacitor must take a period of time, that is, the data writing in the memory requires a certain writing cycle. In order to ensure the accuracy of data writing, sufficient time may be reserved for data writing.

However, the data writing time of the memory may be affected by the temperature, which may cause that the data writing time of the memory is longer than the sufficient time reserved for data writing, so that the data is not completely written into the storage capacitor.

The data writing time of the memory may be affected by the temperature, which may cause that the data writing time of the memory is longer than the sufficient time reserved for data writing, so that the data is not completely written into the storage capacitor.

In order to solve the above problem, a first embodiment of the present disclosure provides a method for regulating a memory, which includes operations as follows. A mapping relationship among temperatures of the transistor, body bias voltages of the transistor, and data writing time of the memory is acquired. A current temperature of the transistor is acquired. The body bias voltage is regulated based on the current temperature and the mapping relationship, so that the data writing time corresponding to the regulated body bias voltage is within a preset writing time.

In order to make the objectives, technical solution and advantages of the embodiments of the present disclosure clearer, all embodiments of the present disclosure are described below in combination with the drawings in detail. However, those of ordinary skill in the art may understand that, in each embodiment of the present disclosure, many technical details are proposed to make readers to better understand the present disclosure. However, the technical solutions protected by the present disclosure may be implemented even without these technical details and various changes and modifications made based on each of the following embodiments. Division of the following embodiments is for convenient description and should not constitute any limitation to specific implementations of the present disclosure. The embodiments may be combined with each other, and reference may be made to the embodiments without conflicts.

Figure 3:
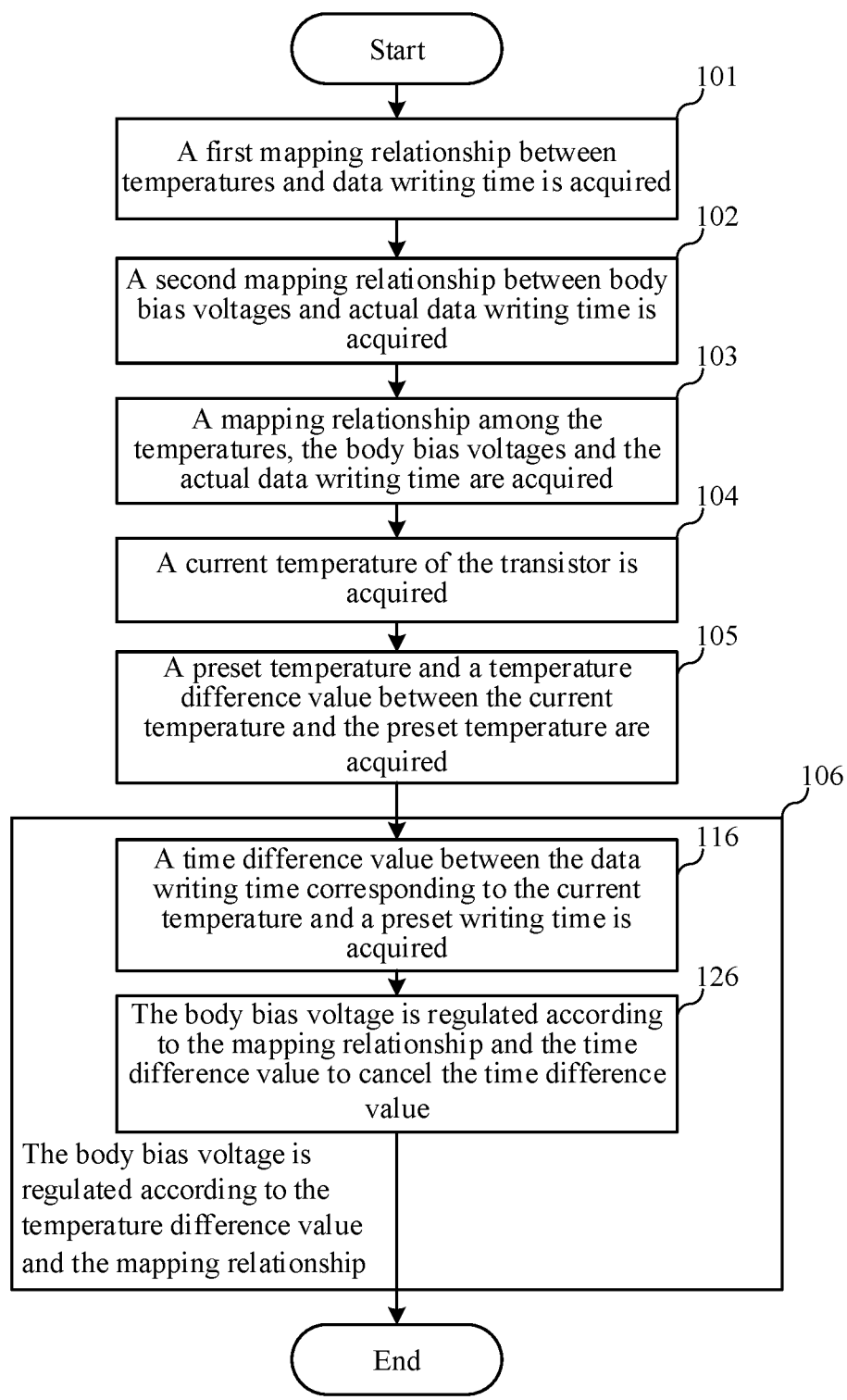
FIG. 3 is a flow diagram of a method for regulating a memory provided by a first embodiment of the present disclosure.

FIG. 3 is a flow diagram of a method for regulating a memory provided by an embodiment of the present disclosure. The method for regulating the memory in this embodiment is described below in detail.

Figure 1:
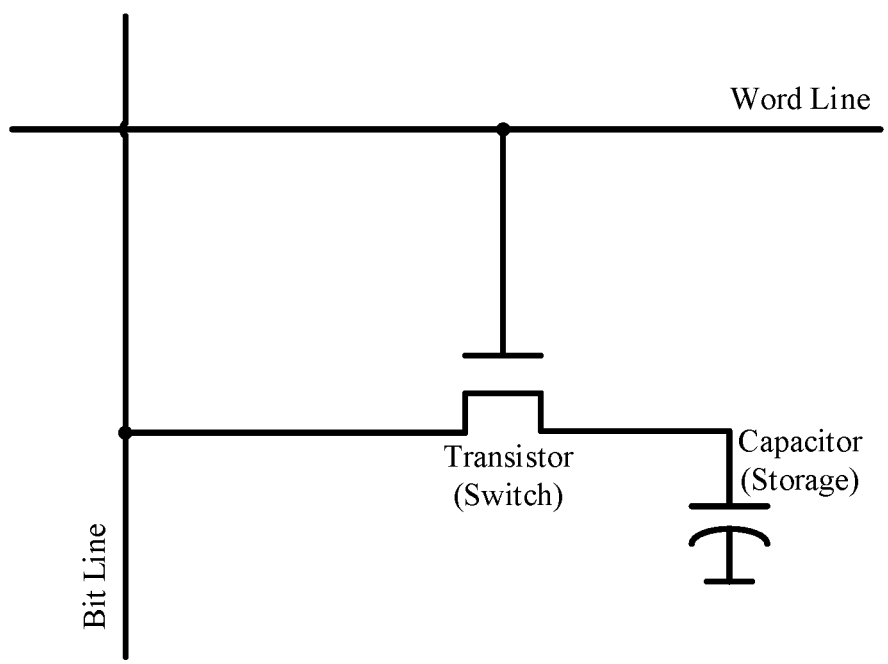
FIG. 1 is a schematic diagram of a transistor connection structure in a memory provided by a first embodiment of the present disclosure.

Referring to FIG. 1, FIG. 1 is a schematic structural diagram of a single storage unit in the memory. The memory has a plurality of storage capacitors, and a target storage capacitor is selected through a bit line (BL) structure and a word line (WL) structure. The WL structure is connected with a gate of a transistor, the BL structure is connected with one of a source/drain of the transistor, and the other of the source/drain of the transistor is connected with the storage capacitor. In the connection structure formed in this way, the transistor functions as a switch, and the storage capacitor functions as a storage. While a gate voltage inputted to the transistor in the WL structure is greater than a threshold voltage of the transistor, the transistor is turned on, and an electrical connection is formed between the storage capacitor and the BL structure. When a voltage of the storage capacitor is less than the voltage of the BL structure, the storage capacitor is discharged, which is a data reading process. When the voltage of the storage capacitor is greater than the voltage of the BL structure, the storage capacitor is charged, which is a data writing process. From the above content, it may be understood that the data reading/writing of the memory is achieved by charging/discharging the storage capacitor in the memory. However, charging should be performed within a certain period of time to ensure execution of the charging process, that is, a certain period of time should be reserved for the data writing in the memory to ensure that the data is completely written.

Figure 2:
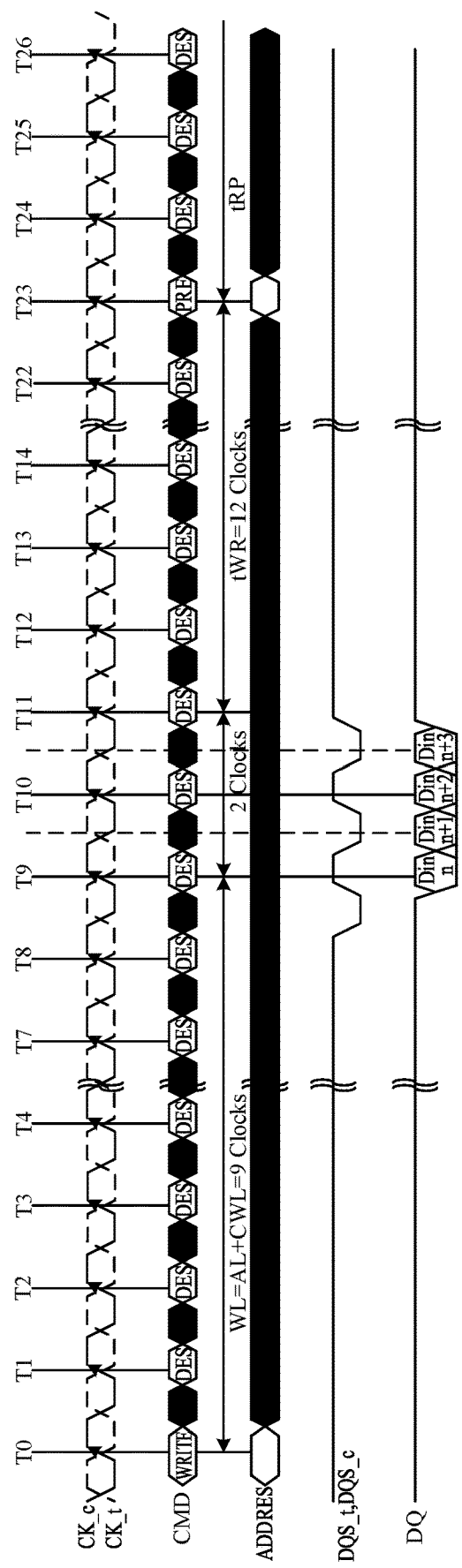
FIG. 2 is a schematic structural diagram of a writing time sequence of a memory provided by a first embodiment of the present disclosure.

FIG. 2 is a time sequence diagram of data writing in the memory. It should be noted that FIG. 2 is only a schematic diagram of a time sequence of writing in a section of storage area, and does not constitute limitation to the embodiments of the present disclosure, and is used for assisting those skilled in the art in understanding the achievement purpose of this solution. As shown in FIG. 2, a command to execute the data writing is received at a moment T0. Because the memory contains many storage capacitors, a target storage capacitor needs to be found before the data writing is executed. T1-T9 are addressing time. After the target storage capacitor is found, the writing operation is executed. T9-T11 are for execution of the writing process. T11-T23 are idle time for ensuring that the data writing is completed performed, that is, a Write Recovery time (tWR). A pre-charging process is performed after T23. After the data is written, the BL structure is pre-charged so that the memory may execute a next operation command normally. T9~T23 are the data writing time of the memory.

Before the memory works, a preset writing time may be set for the memory, and used for the data writing in the memory. In the working process of the memory, data writing time in the memory may be affected by factors such as a temperature of the transistor and a body bias voltage of the transistor. When the data writing time of the memory is less than or equal to the preset writing time, the data writing of the memory is executed normally, and there is idle time in this case. When the data writing time in the memory is greater than the preset writing time, data writing in the memory may not be executed normally. Also, if the preset writing time is set too large, reading-writing efficiency in the memory may be lower. It should be noted that, in the embodiment of the present disclosure, the temperature of the transistor refers to the temperature of the transistor itself.

Referring to FIG. 3, the method for regulating the memory includes the following operations.

It should be noted that in the embodiment of the present disclosure, the body bias voltage of the transistor is regulated to compensate for the influence of the temperature of the transistor on the data writing time in the memory. This does not mean that other factors do not affect the data writing time in the memory. In the embodiment of the present disclosure, in addition to the temperature of the transistor and the body bias voltage of the transistor, other factors that affect the data writing time in the memory are kept unchanged by default.

At S101, a first mapping relationship between temperatures and data writing time is acquired.

Because decrease of the temperature of the transistor may cause increase of a contact resistance R of the transistor, and the decrease of the temperature of the transistor may cause increase of a threshold voltage Vth of the transistor. Correspondingly, the increase of the temperature of the transistor may cause the decrease of the contact resistance R of the transistor, and the increase of the temperature of the transistor may cause the decrease of the threshold voltage Vth of the transistor. When the temperature is fixed, the threshold voltage Vth of the transistor is negatively correlated with the body bias voltage Vbb of the transistor, that is, Vbb increases with the decrease of Vth, and Vbb decreases with the increase of Vth.

From the previous structure description, it may be seen that an electrical connection is formed between the bit line structure and the storage capacitor only when the transistor is turned on. The transistor being turned on means that the gate voltage Vgs of the transistor is greater than Vth, and a difference value Vgs-Vth between Vgs and Vth is positively correlated with a source-drain current Ids of the transistor. That is, the difference value Vgs-Vth between Vgs and Vth increases with the increase of Ids. Ids is a charging current of the storage capacitor. The data writing time in the memory decreases with the increase of Ids.

That is, when the temperature of the transistor decreases, the threshold voltage Vth increases, the source-drain current Ids of the transistor decreases, and the data writing time in the memory becomes longer. When the temperature of the transistor increases, the threshold voltage Vth decreases, the source-drain current Ids of the transistor increases, and the data writing time in the memory becomes shorter.

Specifically, the operation that the first mapping relationship is acquired includes operations as follows. With keeping the body bias voltage of the transistor unchanged, the first mapping relationship between the temperatures of the transistor and the data writing time in the memory is acquired by changing the temperature of the transistor. The first mapping relationship is a two-dimensional mapping relationship, an independent variable is the temperature of the transistor, and a dependent variable is the data writing time in the memory. Then, the body bias voltage of the transistor is changed. With keeping the body bias voltage of the transistor unchanged after the body bias voltage of the transistor is changed, the first mapping relationship between the temperatures of the transistor and the data writing time in the memory is acquired by changing the temperature of the transistor. Therefore, the first mapping relationship of the change of the data writing time in the memory with the temperature of the transistor at the different body bias voltages is acquired.

At S102, a second mapping relationship between the body bias voltages and the data writing time is acquired.

Due to the bias voltage Vbb of the transistor is a negative value (the transistor is an NMOS transistor by default), a p-n junction between the substrate and the source is reverse-biased, which causes that the threshold voltage Vth of the transistor is relatively large, and the source-drain current Ids of the transistor is relatively small.

When the transistor is turned on, with the body bias voltage Vbb of the transistor increases, a reverse biasing degree of the p-n junction between the substrate and the source of the transistor gets small, and the threshold voltage Vth of the transistor decreases to increase Vgs-Vth, so that the source-drain current Ids of the transistor increases, and the data writing time of the storage capacitor becomes shorter. With the body bias voltage Vbb of the transistor decreases, a reverse biasing degree of the p-n junction between the substrate and the source of the transistor gets large, the threshold voltage Vth of the transistor increases to decrease Vgs-Vth, so that the source-drain current Ids of the transistor decreases, and the data writing time of the storage capacitor becomes longer.

Specifically, the operation that the second mapping relationship is acquired includes operations as follows, With keeping the temperature of the transistor unchanged, the second mapping relationship between the body bias voltages of the transistor and the data writing time in the memory is acquired by changing the body bias voltage of the transistor. The second mapping relationship is a two-dimensional mapping relationship, an independent variable is the body bias voltage of the transistor, and a dependent variable is the data writing time in the memory. Then, the temperature of the transistor is changed. With keeping the temperature of the transistor unchanged after the temperature of the transistor is changed, the second mapping relationship between the body bias voltages of the transistor and the data writing time in the memory is acquired by changing the body bias voltage of the transistor. Therefore, the second mapping relationship of the change of the data writing time in the memory with the body bias voltage of the transistor at the different temperatures is acquired.

At S103, a mapping relationship among the temperatures, the body bias voltages and the data writing time is acquired.

Specifically, the mapping relationship among the temperatures of the transistor, the body bias voltages of the transistor, and the data writing time of the memory is acquired based on the first mapping relationship and the second mapping relationship, and the mapping relationship is a three-dimensional mapping relationship.

It should be noted that operations S101, S102, and S103 in this embodiment give a specific method for acquiring the mapping relationship among the temperatures of the transistor, the body bias voltages of the transistor, and the data writing time in the memory. The one-to-one correspondences of data can ensure the accuracy of regulating the data writing time in the memory. In other embodiments, the above mapping relationship among the temperatures, the body bias voltages and the data writing time may be directly acquired by regulating the relationship among the temperatures, the body bias voltages and the data writing time.

At S104, a current temperature of the transistor is acquired.

Specifically, in this embodiment, the current temperature of the transistor is acquired by a temperature sensor arranged in the memory. The current temperature of the transistor is directly acquired by the temperature sensor, and the acquired temperature is accurate and the error is small. In other embodiments, the current temperature of the transistor may also be acquired by acquiring a temperature of an environment at which the memory works.

At S105, a preset temperature and a temperature difference between the current temperature and the preset temperature is acquired.

At S106, the body bias voltage is regulated according to the temperature difference and the mapping relationship. In this embodiment, the method of regulating the body bias voltage according to the temperature difference and the mapping relationship includes the following operations 116 and 126.

At S116, a time difference value between the data writing time corresponding to the current temperature and a preset writing time is acquired.

A preset temperature of the transistor, a preset body bias voltage of the transistor, and a preset writing time in the transistor are set before the memory is powered on. Herein, the preset temperature, the preset body bias voltage and the preset writing time may also meet the above mapping relationship.

According to the temperature difference value between the current temperature and the preset temperature, the time difference value between the data writing time of the memory and the preset writing time under the current body bias voltage of the transistor is acquired. That is, a change of the data writing time in the memory caused by the temperature change is acquired.

At S126, the body bias voltage is regulated according to the mapping relationship and the time difference value to cancel the time difference value.

Since the temperature of the transistor changes, the data writing time in the memory changes, but this change is not beneficial for the use of the memory. Therefore, it is necessary to regulate the body bias voltage of the transistor to stabilize the data writing time of the memory. That is, the time difference value is cancelled by regulating the body bias voltage, thereby stabilizing the data writing time in the memory.

Compared with an existing technology, since the temperature may affect the data writing time in the memory, the mapping relationship among the temperatures of the transistor, the body bias voltages of the transistor, and the data writing time is acquired firstly, and the data writing time is acquired according to the current temperature of the transistor, the data writing time in the memory of the transistor at the current temperature is regulated by regulating the body bias voltage of the transistor, so that the regulated data writing time is within the preset time, thereby ensuring that the data is completely written into the storage capacitor.

The above division of the various operations is only for clarity of description. While implemented, the operations may be combined into one operation or some operations may be divided into a plurality of operations, as long as the operations include the same logical relationship, all of the combination and division fall within a scope of protection of the present disclosure. In a process, adding insignificant modifications or introducing insignificant designs in the process without changing core design of the process are all within the scope of protection of the present disclosure.

A second embodiment of the present disclosure relates to a method for regulating a memory. The difference from the first embodiment is that in this embodiment, before regulating the body bias voltage according to the temperature difference value, whether the temperature difference value exceeds a preset range is determined. The data writing time of the memory is regulated only when the temperature difference value exceeds the preset range, thereby reducing unnecessary adjustment operations, and saving the regulating cost.

Figure 4:
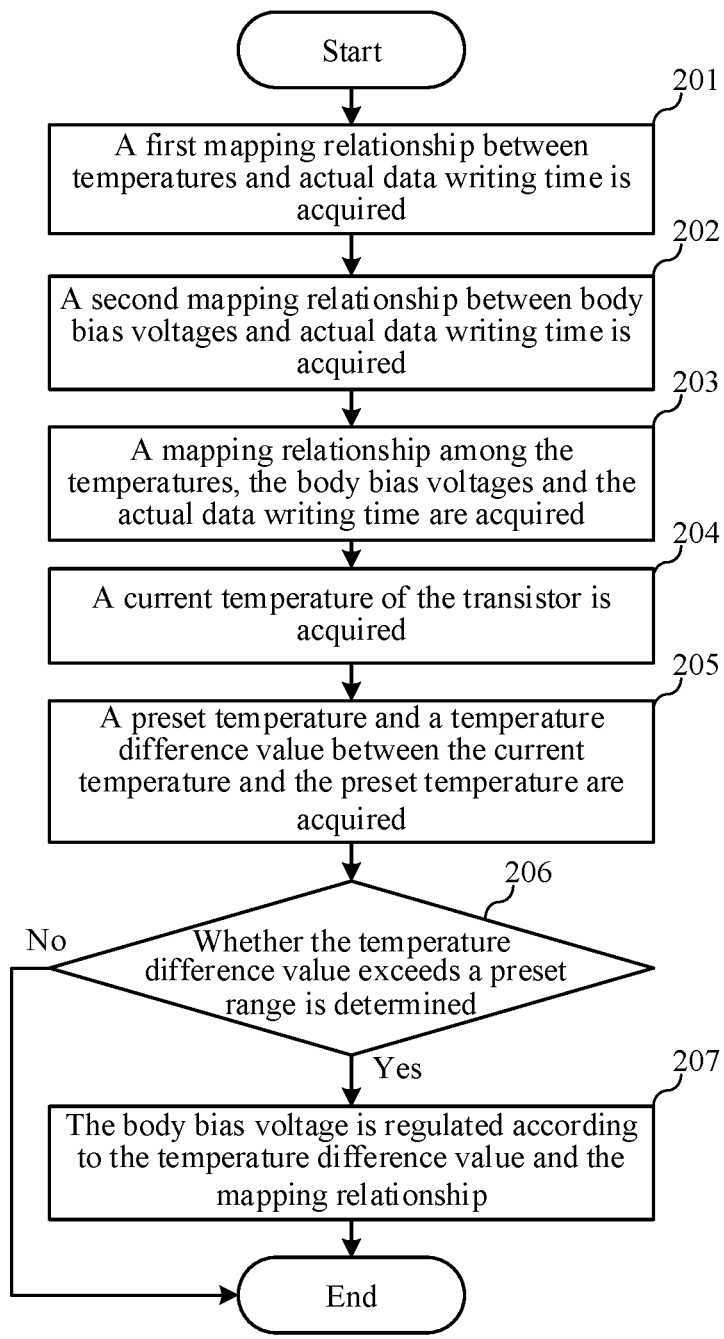
FIG. 4 is a flow diagram of a method for regulating a memory provided by a second embodiment of the present disclosure.

FIG. 4 is a flow diagram of the method for regulating a memory provided by an embodiment of the present disclosure. The method for regulating the memory in this embodiment is specifically described below.

Referring to FIG. 4, the method for regulating the memory includes the following operations 201 to 207.

At S201, a first mapping relationship between temperatures and data writing time is acquired.

At S202, a second mapping relationship between body bias voltages and the data writing time is acquired.

At S203, a mapping relationship among the temperatures, the body bias voltages, and the writing time is acquired.

At S204, a current temperature of the transistor is acquired.

At S205, a preset temperature and a temperature difference value between the current temperature and the preset temperature are acquired.

Herein, operations S201 to S205 are the same as operations S101 to S105 in the first embodiment, and are not repeatedly described in this embodiment.

At S206, whether the temperature difference value exceeds a preset range is determined.

In this embodiment, whether the temperature difference value between the current temperature of the transistor and the preset temperature exceeds the preset range is determined before regulating the body bias voltage of the transistor.

If the temperature difference value exceeds the preset range, the body bias voltage of the transistor is regulated according to the temperature difference value and the mapping relationship, that is, operation S207 is performed.

At S207, the body bias voltage is regulated according to the temperature difference value and the mapping relationship.

Specifically, when a value obtained by subtracting the preset temperature from the current temperature exceeds the preset range, and the transistor is an N-type transistor, the regulating manner is to increase the body bias voltage. When a value obtained by subtracting the current temperature from the preset temperature exceeds the preset range, and the transistor is the N-type transistor, the regulating manner is to decrease the body bias voltage. When a value obtained by subtracting the preset temperature from the current temperature exceeds the preset range, and the transistor is a P-type transistor, the regulating manner is to decrease the body bias voltage. When a value obtained by subtracting the current temperature from the preset temperature exceeds the preset range, and the transistor is the P-type transistor, the regulating manner is to increase the body bias voltage.

Further, the preset range is divided in this embodiment, the preset range at least includes a first preset range and a second preset range, and the second preset range is larger than the first preset range.

When the temperature difference value exceeds the first preset range and does not exceed the second preset range, the body bias voltage is increased or decreased, and the increased or decreased amount is a first preset value. When the temperature difference value exceeds the second preset range, the body bias voltage is increased or decreased, and the increased or decreased amount is a second preset value. The second preset value is greater than the first preset value, and the first preset value and the second preset value are fixed values. By dividing and controlling the preset range, the accuracy of regulating the data writing time in the memory is improved while saving the regulation cost.

It should be noted that in other embodiments, the preset range is divided into at least three sub-preset ranges. By dividing into more sub-preset ranges, the accuracy of regulating the data writing time in the memory is further improved.

Compared with the existing technology, since the temperature may affect the data writing time of the memory, the mapping relationship among the temperatures of the transistor, the body bias voltages of the transistor and the data writing time is acquired firstly, and the data writing time of the memory is acquired according to the current temperature of the transistor, the data writing time of the memory of the transistor at the current temperature is regulated by regulating the body bias voltage of the transistor, so that the regulated data writing time is within the preset time, thereby ensuring that the data is completely written into the storage capacitor.

The above division of the various operations is only for clarity of description. While implemented, the operations may be combined into one operation or some operations may be divided into a plurality of operations, as long as the operations include the same logical relationship, all of the combination and division fall within a scope of protection of the present disclosure. In a process, adding insignificant modifications or introducing insignificant designs in the process without changing core design of the process are all within the scope of protection of the present disclosure A third embodiment of the present disclosure relates to a system for regulating a memory.

Figure 5:
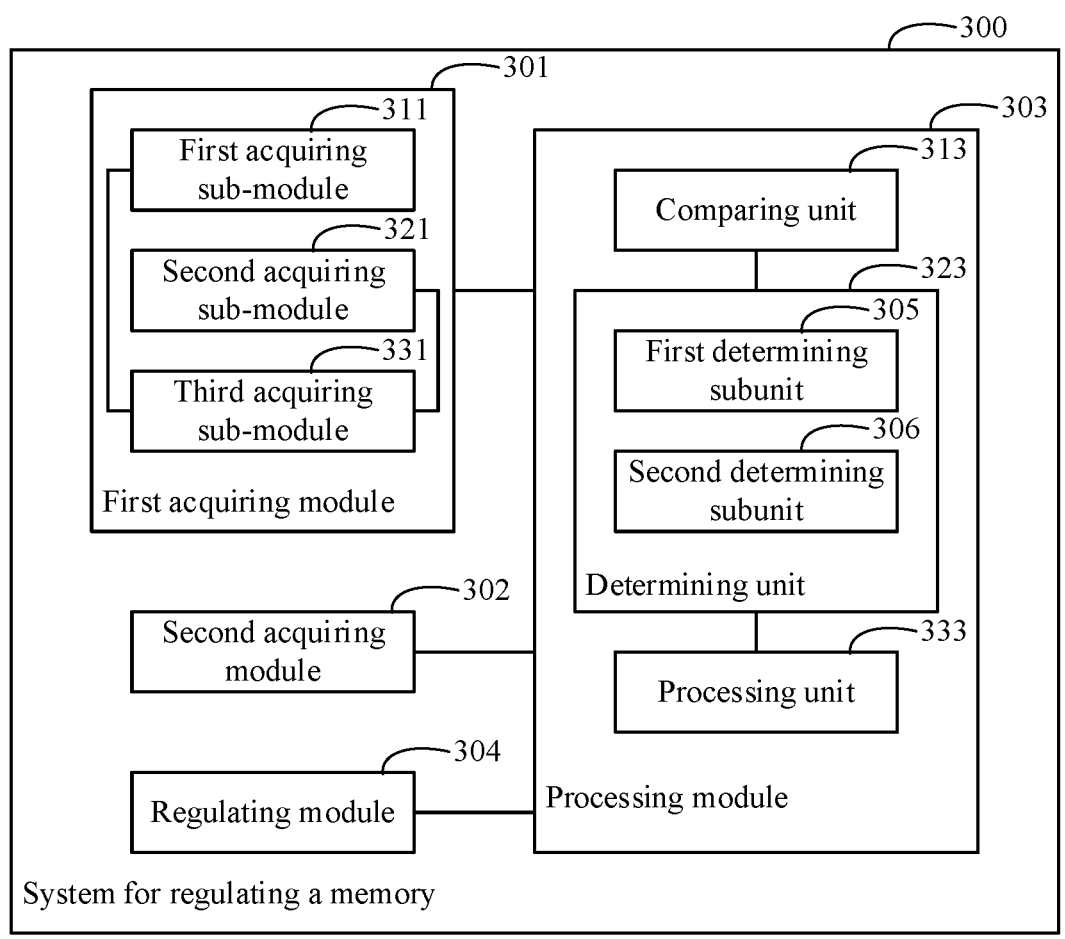
FIG. 5 is a schematic structural diagram of a system for regulating a memory provided by a third embodiment of the present disclosure.

Referring to FIG. 5, the system for regulating the memory provided in this embodiment is described in detail below in combination with the drawings. The parts that are the same as or corresponding to the first embodiment and the second embodiment are not repeatedly described in detail below.

The system 300 for regulating the memory includes a first acquiring module 301, a second acquiring module 302, a processing module 303, and a regulating module 304.

The first acquiring module 301 is configured to acquire a mapping relationship among temperatures of the transistor, body bias voltages of the transistor, and data writing time of the memory. The mapping relationship is a three-dimensional mapping relationship.

The second acquiring module 302 is configured to acquire a current temperature of the transistor.

Specifically, in this embodiment, the current temperature of the transistor is acquired by a temperature sensor arranged in the memory. When the current temperature of the transistor is directly acquired by the temperature sensor, the acquired temperature is accurate and the error is small. In other embodiments, the current temperature of the transistor may also be acquired by acquiring a temperature of an environment at which the memory works.

The processing module 303 is configured to acquire a regulating manner of the body bias voltage based on the current temperature and the mapping relationship.

In this embodiment, the processing module includes a comparing unit 313 and a processing unit 333.

The comparing unit 313 is configured to acquire a preset temperature corresponding to a preset writing time, and acquire a temperature difference value between the current temperature and the preset temperature.

The processing unit 333 is configured to acquire a regulating manner of the body bias voltage according to the temperature difference value and the mapping relationship.

Specifically, a preset temperature of the transistor, a preset body bias voltage of the transistor, and a preset writing time of the transistor may be set before the memory is powered on. The preset temperature, the preset body bias voltage and the preset writing time may also meet the above mapping relationship. The processing unit 333, according to the temperature difference value between the current temperature and the preset temperature, acquires a time difference value between the data writing time of the memory and the preset writing time under the current body bias voltage of the transistor. That is, a change of the data writing time of the memory caused by the temperature change is acquired. With the temperature change of the transistor, the data writing time of the memory is changed, which is not beneficial to the use of the memory. Therefore, the body bias voltage of the transistor should be regulated by the processing unit 333 to stabilize the data writing time of the memory. That is, the body bias voltage is regulated according to the mapping relationship and the time difference value to cancel the time difference value, thereby stabilizing the data writing time of the memory.

The regulating module 304 is configured to regulate the body bias voltage, based on the regulating manner, to enable the data writing time of the memory corresponding to the regulated body bias voltage to be within the preset writing time.

In an example, the first acquiring module 301 includes a first acquiring sub-module 311, a second acquiring sub-module 321, and a third acquiring sub-module 331.

The first acquiring sub-module 311 is configured to acquire a first mapping relationship between the temperatures of the transistor and the data writing time of the memory. Specifically, with keeping the body bias voltage of the transistor unchanged, the first mapping relationship between the temperatures of the transistor and the data writing time of the memory is acquired. An independent variable is the temperature of the transistor, and a dependent variable is the data writing time of the memory. The first mapping relationship is a two-dimensional mapping relationship.

The second acquiring sub-module 321 is configured to acquire a second mapping relationship between the body bias voltages of the transistor and the data writing time of the memory. Specifically, with keeping the temperature of the transistor unchanged, the second mapping relationship between the body bias voltages of the transistor and the data writing time of the memory is acquired. An independent variable is the body bias voltage of the transistor, a dependent variable is the data writing time of the memory, and the second mapping relationship is a two-dimensional mapping relationship.

The third acquiring sub-module 331 is configured to acquire a mapping relationship among the temperatures of the transistor, the body bias voltages of the transistor, and the data writing time of the memory based on first mapping relationship and the second mapping relationship.

In an example, the processing module 303 further includes a determining unit 323 configured to determine whether a temperature difference value exceeds a preset range. When the temperature difference value exceeds the preset range, the processing unit 333 is configured to acquire a regulating manner of the body bias voltage according to the temperature difference value and the mapping relationship.

Specifically, the determining unit 323 at least includes a first determining subunit 305 and a second determining subunit 306. By dividing and controlling the preset range, the accuracy of regulating the data writing time in the memory is improved on the basis of saving the regulation cost.

The first determining subunit 305 is configured to determine whether the temperature difference value exceeds the first preset range.

The second determining subunit 306 is configured to determine whether the temperature difference value exceeds the second preset range. The second preset range is greater than the first preset range.

It should be noted that in other embodiments, the determining unit at least includes three determining sub-units. The preset range is divided into at least three preset sub-ranges. Dividing into more preset sub-ranges can further improve the accuracy of regulating the data writing time of the memory.

Compared with the existing technology, since the temperature may affect the data writing time of the memory, the mapping relationship among the temperatures of the transistor, the body bias voltages of the transistor, and the data writing time of the memory is acquired by the first acquiring module, the data writing time of the memory is acquired according to the current temperature of the transistor by the second acquiring module, and the regulating manner of the body bias voltage of the transistor is acquired by the processing module, and then the body bias voltage of the transistor is regulated by the regulating module to regulate the data writing time of the memory of the transistor at the current temperature, so that the regulated data writing time is within the preset time, thereby ensuring that the data is completely written into the storage capacitor.

It is worth mentioning that the modules involved in this embodiment are all logical modules. In practical applications, a logical unit may be a physical unit, or a part of a physical unit, or may be implemented by a combination of a plurality of physical units. In addition, in order to highlight the innovative part of the present disclosure, this embodiment does not introduce a unit that is not closely related to solving the technical problem proposed by the present disclosure, but this does not indicate that the embodiment does not include the unit.

Since the first embodiment and the second embodiment correspond to this embodiment, this embodiment may be implemented in cooperation with the first embodiment and the second embodiment. The related technical details mentioned in the first and second embodiments are still valid in this embodiment, and the technical effects that may be achieved in the first and second embodiments may also be achieved in this embodiment. In order to reduce repetition, it is not repeatedly described here. Correspondingly, the related technical details mentioned in this embodiment may also be applied to the first embodiment and the second embodiment.

A fourth embodiment of the present disclosure relates to a semiconductor device.

The semiconductor device includes a memory and the system for regulating the memory provided in the third embodiment. The system for regulating the memory regulates a body bias voltage of the transistor based on a temperature of the transistor in the memory, so that the data writing time of the memory corresponding to the regulated body bias voltage is within the preset writing time.

Since the first embodiment and the second embodiment correspond to this embodiment, this embodiment may be implemented in cooperation with the first embodiment and the second embodiment. The related technical details mentioned in the first and second embodiments are still valid in this embodiment, and the technical effects that may be achieved in the first and second embodiments may also be achieved in this embodiment. In order to reduce repetition, it is not repeatedly described here. Correspondingly, the related technical details mentioned in this embodiment may also be applied to the first embodiment and the second embodiment.

Those of ordinary skill in the art may understand that the above embodiments are specific embodiments for achieving the present disclosure. In actual applications, various changes may be made in forms and details without departing from the spirit and scope of the present disclosure.

In the embodiments of the present disclosure, a mapping relationship among temperatures of the transistor, body bias voltages of the transistor, and data writing time is acquired, a current temperature of the transistor is acquired, and the body bias voltage is regulated based on the current temperature and the mapping relationship, so that data writing time corresponding to the regulated body bias voltage is within a preset writing time. In this way, since the temperature may affect the data writing time of the memory, the mapping relationship among the temperatures of the transistor, the body bias voltages of the transistor, and the data writing time is acquired firstly, and the data writing time is acquired according to the current temperature of the transistor, the data writing time of the transistor at the current temperature is regulated by regulating the body bias voltage of the transistor, so that the regulated data writing time is within the preset time, thereby ensuring that the data is completely written into the storage capacitor.

What is claimed is:

1. A method for regulating a memory, wherein the memory comprises a transistor, a gate of the transistor is electrically connected with a word line of the memory, one of a source or a drain of the transistor is electrically connected with a bit line of the memory, and other of the source or the drain of the transistor is electrically connected with a storage capacitor of the memory, the method comprising:
   acquiring a mapping relationship among temperatures of the transistor, body bias voltages of the transistor, and data writing time of the memory;
   acquiring a current temperature of the transistor; and
   regulating the body bias voltage based on the current temperature and the mapping relationship, to enable the data writing time corresponding to the regulated body bias voltage to be within a preset writing time.

2. The method for regulating the memory of claim 1, wherein the regulating the body bias voltage based on the current temperature and the mapping relationship comprises:
   acquiring a preset temperature corresponding to the preset writing time;
   acquiring a temperature difference value between the current temperature and the preset temperature; and
   regulating the body bias voltage according to the temperature difference value and the mapping relationship.

3. The method for regulating the memory of claim 2, further comprising: before the regulating the body bias voltage according to the temperature difference value and the mapping relationship,
   determining whether the temperature difference value exceeds a preset range; and
   regulating the body bias voltage according to the temperature difference value and the mapping relationship, when the temperature difference value exceeds the preset range.

4. The method for regulating the memory of claim 2, wherein the regulating the body bias voltage according to the temperature difference value and the mapping relationship comprises:
   acquiring a time difference value between the data writing time corresponding to the current temperature and the preset writing time according to the mapping relationship; and
   regulating the body bias voltage according to the mapping relationship and the time difference value to cancel the time difference value.

5. The method for regulating the memory of claim 3, wherein the preset range at least comprises a first preset range and a second preset range, and the second preset range is larger than the first preset range, the method further comprising
   increasing or decreasing the body bias voltage when the temperature difference value exceeds the first preset range and does not exceed the second preset range, wherein increased or decreased amount is a first preset value; and
   increasing or decreasing the body bias voltage when the temperature difference value exceeds the second preset range, wherein increased or decreased amount is a second preset value, and the second preset value is greater than the first preset value.

6. The method for regulating the memory of claim 1, wherein the acquiring the mapping relationship among temperatures of the transistor, body bias voltages of the transistor, and data writing time of the memory comprises:
   acquiring a first mapping relationship between the temperatures of the transistor and the data writing time of the memory;
   acquiring a second mapping relationship between the body bias voltages of the transistor and the data writing time of the memory; and
   acquiring the mapping relationship among the temperatures of the transistor, the body bias voltages of the transistor, and the data writing time of the memory based on the first mapping relationship and the second mapping relationship.

7. A system for regulating a memory, the system being applied to the memory, wherein the memory comprises a transistor, and the system comprises:
   a first acquiring module configured to acquire a mapping relationship among temperatures of the transistor, body bias voltages of the transistor and data writing time of the memory;
   a second acquiring module configured to acquire a current temperature of the transistor;
   a processing module configured to acquire a regulating manner of the body bias voltage based on the current temperature and the mapping relationship; and
   a regulating module configured to regulate the body bias voltage based on the regulating manner, to enable the data writing time of the memory corresponding to the regulated body bias voltage to be within a preset writing time.

8. The system for regulating the memory of claim 7, wherein the second acquiring module comprises a temperature sensor arranged in the memory.

9. The system for regulating the memory of claim 7, wherein the processing module comprises:

a comparing unit configured to acquire a preset temperature corresponding to the preset writing time, and acquire a temperature difference value between the current temperature and the preset temperature; and a processing unit configured to acquire the regulating manner of the body bias voltage according to the temperature difference value and the mapping relationship.

10. The system for regulating the memory of claim 9, wherein the processing module further comprises a determining unit configured to determine whether the temperature difference value exceeds a preset range, and when the temperature difference value exceeds the preset range, the processing unit is configured to acquire the regulating manner of the body bias voltage according to the temperature difference value and the mapping relationship.

11. The system for regulating the memory of claim 10, wherein the determining unit at least comprises a first determining subunit and a second determining subunit, the first determining subunit is configured to determine whether the temperature difference value exceeds a first preset range; and the second determining subunit is configured to determine whether the temperature difference value exceeds a second preset range, wherein the second preset range is greater than the first preset range.

12. The system for regulating the memory of claim 7, wherein the first acquiring module comprises:

a first acquiring sub-module configured to acquire a first mapping relationship between the temperatures of the transistor and the data writing time of the memory;

a second acquiring sub-module configured to acquire a second mapping relationship between the body bias voltages of the transistor and the data writing time of the memory; and a third acquiring sub-module configured to, based on the first mapping relationship and the second mapping relationship, acquire a mapping relationship among the temperatures of the transistor, the body bias voltages of the transistor, and the data writing time of the memory.

13. A semiconductor device comprising a memory, and a system for regulating the memory, wherein the memory comprises a transistor, and the system comprises a processor configured to:

acquire a mapping relationship among temperatures of the transistor, body bias voltages of the transistor and data writing time of the memory;

acquire a current temperature of the transistor;

acquire a regulating manner of the body bias voltage based on the current temperature and the mapping relationship; and regulate the body bias voltage based on the regulating manner, to enable the data writing time of the memory corresponding to the regulated body bias voltage to be within a preset writing time.

14. The semiconductor device of claim 13, wherein the system further comprises a temperature sensor arranged in the memory.

15. The semiconductor device of claim 13, wherein the processor is further configured to:

acquire a preset temperature corresponding to the preset writing time, and acquire a temperature difference value between the current temperature and the preset temperature; and acquire the regulating manner of the body bias voltage according to the temperature difference value and the mapping relationship.

16. The semiconductor device of claim 15, wherein the processor is further configured to:

determine whether the temperature difference value exceeds a preset range;

acquire the regulating manner of the body bias voltage according to the temperature difference value and the mapping relationship, when the temperature difference value exceeds the preset range.

17. The semiconductor device of claim 16, wherein the processor is further configured to:

determine whether the temperature difference value exceeds a first preset range; and determine whether the temperature difference value exceeds a second preset range, wherein the second preset range is greater than the first preset range.

18. The semiconductor device of claim 13, wherein the processor is further configured to:

acquire a first mapping relationship between the temperatures of the transistor and the data writing time of the memory;

acquire a second mapping relationship between the body bias voltages of the transistor and the data writing time of the memory; and acquire a mapping relationship among the temperatures of the transistor, the body bias voltages of the transistor, and the data writing time of the memory based on the first mapping relationship and the second mapping relationship.

* * * * *